(12) United States Patent
Parkinson et al.

(10) Patent No.: US 10,373,682 B2
(45) Date of Patent: Aug. 6, 2019

(54) WRITE SET OPERATION FOR MEMORY DEVICE WITH BIT LINE CAPACITOR DRIVE

(71) Applicant: SanDisk Technologies LLC, Plano, TX (US)

(72) Inventors: Ward Parkinson, Boise, ID (US); James O'Toole, Boise, ID (US); Thomas Trent, Tucson, AZ (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/855,903

(22) Filed: Dec. 27, 2017

(65) Prior Publication Data
US 2019/0198106 A1   Jun. 27, 2019

(51) Int. Cl.
| | | |
|---|---|---|
| *G11C 13/00* | (2006.01) | |
| *G11C 7/04* | (2006.01) | |
| *G11C 11/56* | (2006.01) | |
| *G11C 11/16* | (2006.01) | |

(52) U.S. Cl.
CPC ............ *G11C 13/0069* (2013.01); *G11C 7/04* (2013.01); *G11C 11/1675* (2013.01); *G11C 11/5685* (2013.01); *G11C 13/0004* (2013.01); *G11C 13/0023* (2013.01); *G11C 13/0038* (2013.01); *G11C 2013/0071* (2013.01); *G11C 2013/0083* (2013.01); *G11C 2013/0092* (2013.01)

(58) Field of Classification Search
CPC ... G11C 13/0069; G11C 7/04; G11C 11/5685; G11C 13/0007; G11C 13/0061; G11C 11/1675; G11C 13/004; G11C 2013/0092; G11C 2013/0071; G11C 2013/0083
See application file for complete search history.

(56) References Cited

U.S. PATENT DOCUMENTS

| | | | |
|---|---|---|---|
| 6,928,022 B2 | 8/2005 | Cho et al. | |
| 7,307,268 B2 | 12/2007 | Scheuerlein | |
| 7,349,275 B2* | 3/2008 | Tsukada | G11C 7/08 365/149 |
| 7,365,355 B2 | 4/2008 | Parkinson | |
| 7,417,887 B2 | 8/2008 | Cho et al. | |

(Continued)

OTHER PUBLICATIONS

Texas Instruments, "DAC7811 12-Bit, Serial Input, Multiplying Digital-to-Analog Converter," DAC7811, Apr. 2005, Revised Sep. 2016, 29 pages.

*Primary Examiner* — Vanthu T Nguyen
(74) *Attorney, Agent, or Firm* — Vierra Magen Marcus LLP

(57) ABSTRACT

Apparatuses and techniques are described for programming phase change memory cells while avoiding a clamp condition in transistors which are used for biasing a word line and bit line when the word line and bit line are unselected for a write operation. The transistors may be connected in parallel with the word line and bit line. During a write operation, a current source is connected to a selected word line and a voltage control circuit is connected to the selected bit line. The voltage control circuit can include a capacitor or a voltage driver, for example. The capacitor accumulates charge, or the voltage driver applies an increasing ramp voltage to the bit line, to increase the voltage of the bit line and word line during the write operation and to avoid the clamp condition.

14 Claims, 11 Drawing Sheets

(56) References Cited

U.S. PATENT DOCUMENTS

| | | | |
|---|---|---|---|
| 7,515,461 B2* | 4/2009 | Happ | G11C 11/5678 |
| | | | 365/148 |
| 7,535,756 B2* | 5/2009 | Lung | G11C 11/5678 |
| | | | 365/148 |
| 7,586,776 B2* | 9/2009 | Oh | G11C 8/10 |
| | | | 365/148 |
| 7,687,830 B2 | 3/2010 | Pellizzer et al. | |
| 7,692,979 B2 | 4/2010 | Fuji et al. | |
| 7,920,405 B2* | 4/2011 | Kang | B82Y 10/00 |
| | | | 365/148 |
| 7,944,274 B2 | 5/2011 | Kushima et al. | |
| 8,189,373 B2 | 5/2012 | Kang et al. | |
| 8,203,872 B2 | 6/2012 | Parkinson | |
| 8,288,829 B2 | 10/2012 | Zhang et al. | |
| 8,526,227 B2* | 9/2013 | Pyeon | G11C 8/08 |
| | | | 365/148 |
| 8,879,311 B2 | 11/2014 | Pyeon | |
| 8,908,413 B2 | 12/2014 | Lowrey et al. | |
| 8,917,534 B2 | 12/2014 | Castro | |
| 8,934,280 B1 | 1/2015 | Kuo et al. | |
| 9,076,521 B2 | 7/2015 | Parkinson | |
| 9,153,320 B2 | 10/2015 | Franklin et al. | |
| 9,190,147 B2 | 11/2015 | Minemura et al. | |
| 9,208,889 B2 | 12/2015 | Toyama et al. | |
| 9,355,721 B2* | 5/2016 | Yoon | G11C 13/0069 |
| 9,525,007 B2 | 12/2016 | Pellizzer et al. | |
| 9,613,698 B2 | 4/2017 | Mantegazza et al. | |
| 9,711,213 B2 | 7/2017 | Castro et al. | |
| 2005/0169093 A1 | 8/2005 | Choi et al. | |
| 2006/0104131 A1 | 5/2006 | Sugawara et al. | |
| 2015/0049543 A1 | 2/2015 | Pyeon | |

\* cited by examiner

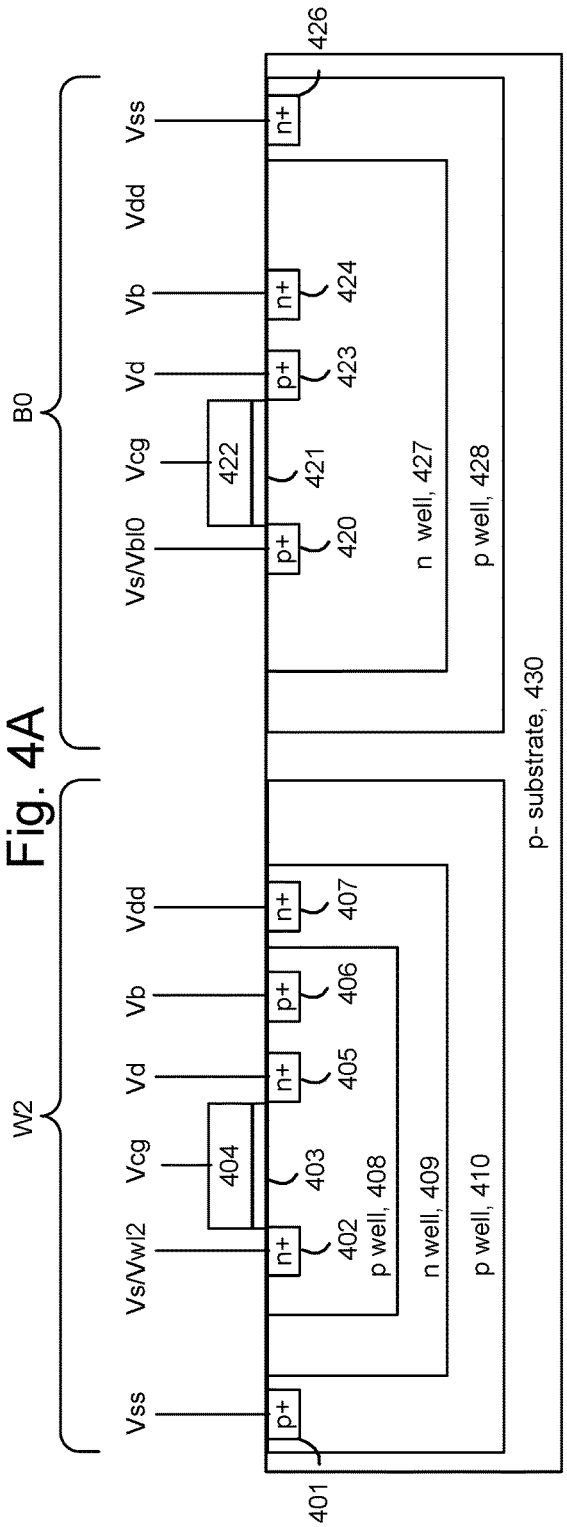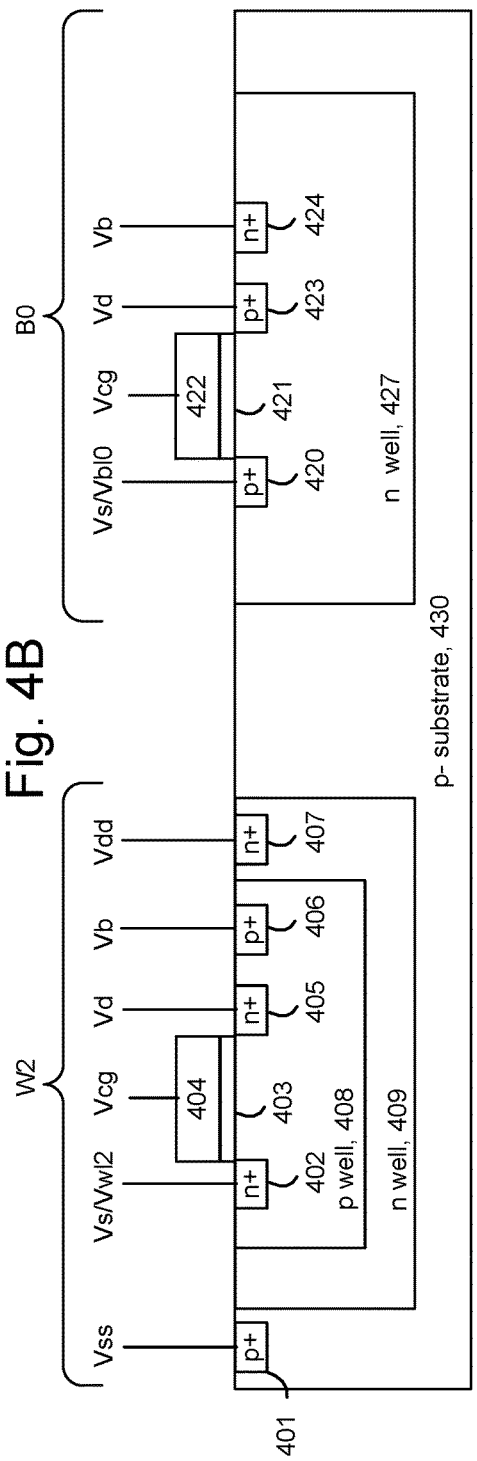

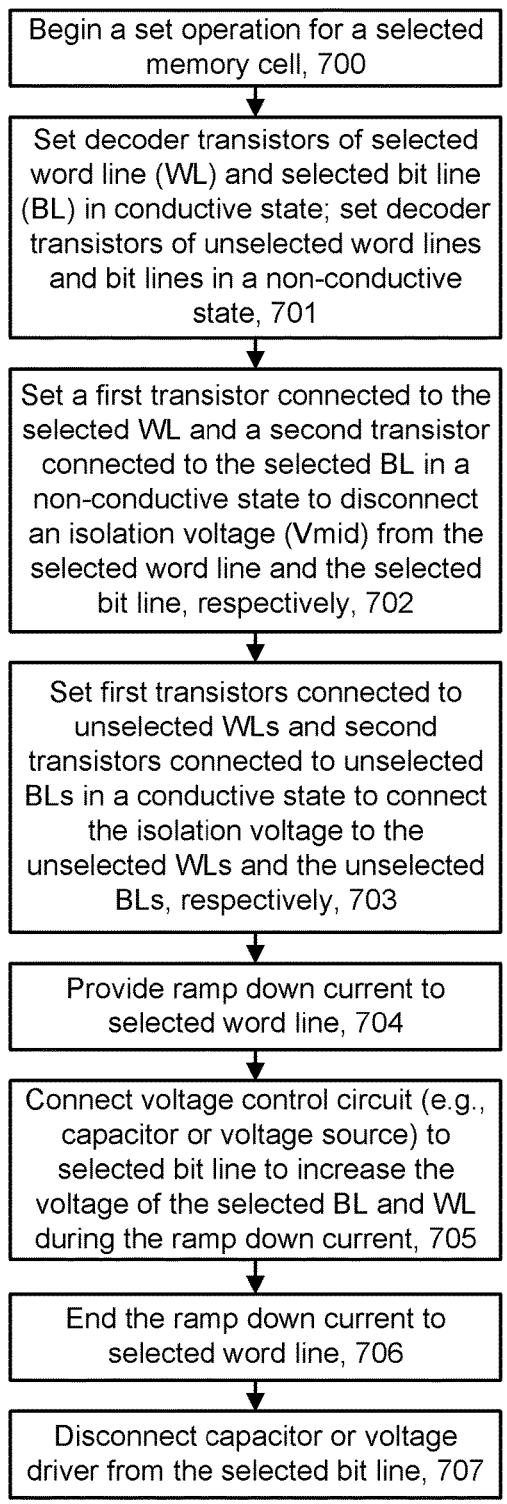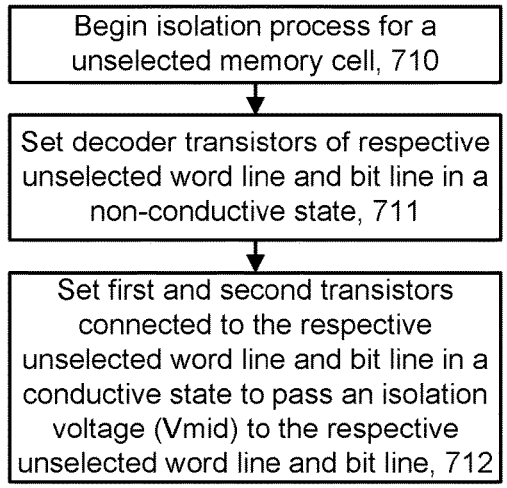

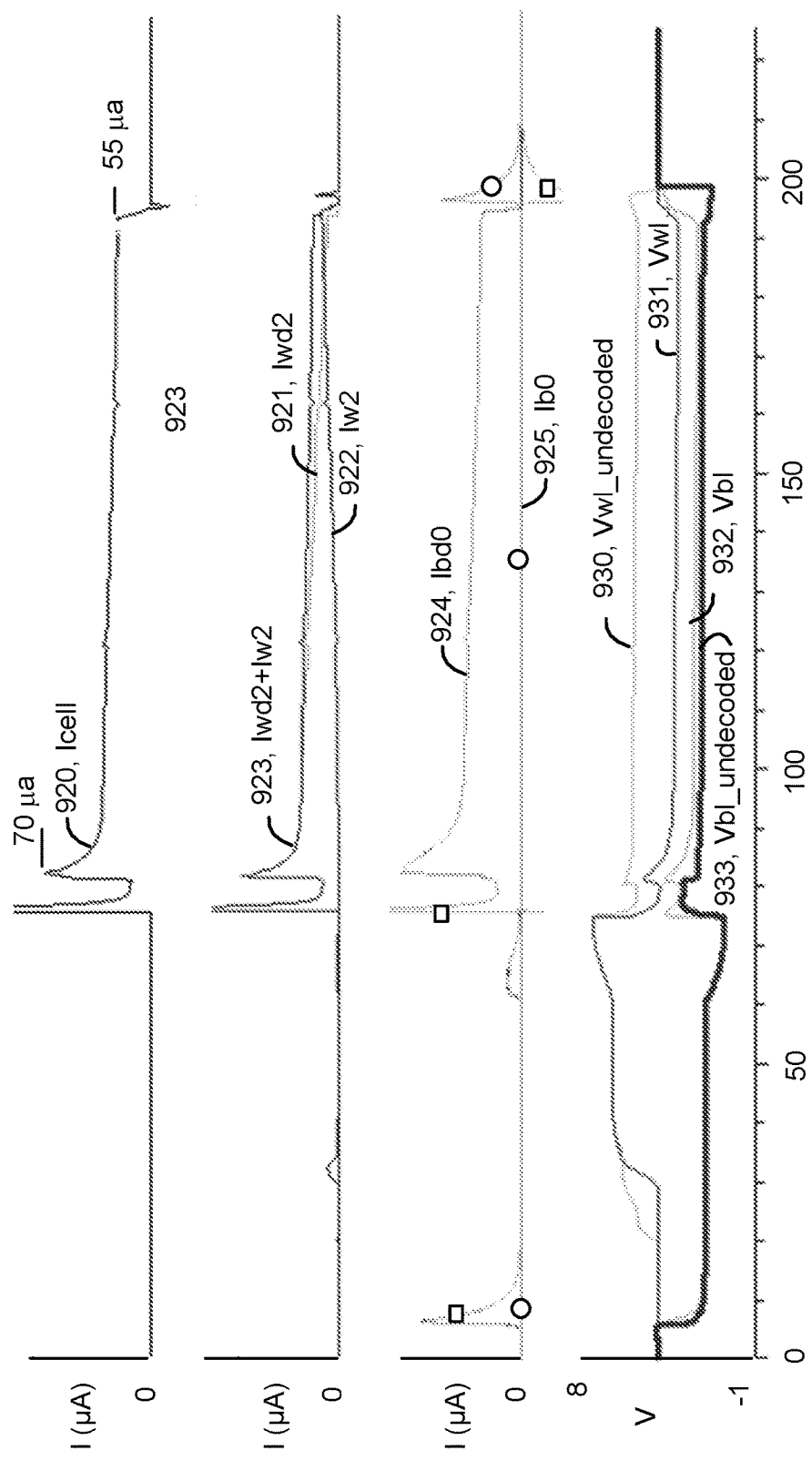

WRITE SET OPERATION FOR MEMORY DEVICE WITH BIT LINE CAPACITOR DRIVE

BACKGROUND

The present technology relates to a memory device and to techniques for programming memory cells. Memory devices can include phase change memory cells which store one or more bits of data based on a variable resistance level. In one approach, a set operation is used to place a memory cell in a low resistance state, representing one bit value, and a reset operation is used to place the memory cell in a high resistance state, representing another bit value. The transition from one state to another can involve passing a current through the memory cell. However, various challenges are presented in operating such devices.

BRIEF DESCRIPTION OF THE DRAWINGS

FIG. 4A depicts an example triple-well configuration of the example first transistor W2 of the selected word line WL2 and the second transistor B0 of the selected bit line BL0 of FIG. 2A.

FIG. 4B depicts another example triple-well configuration of the example first transistor W2 of the selected word line WL2 and the second transistor B0 of the selected bit line BL0 of FIG. 2A.

FIG. 7A depicts a flowchart of an example process for performing a set operation for a selected memory cell.

FIG. 7B depicts a flowchart of an example process for isolating memory cells in the set operation of FIG. 7A.

FIG. 9B depicts an example plot of currents and voltages versus time in a set operation for a selected memory cell, using a circuit similar to the circuit of FIG. 2A but excluding the voltage control circuit, as a comparison to FIG. 9A.

DETAILED DESCRIPTION

Figure 1:
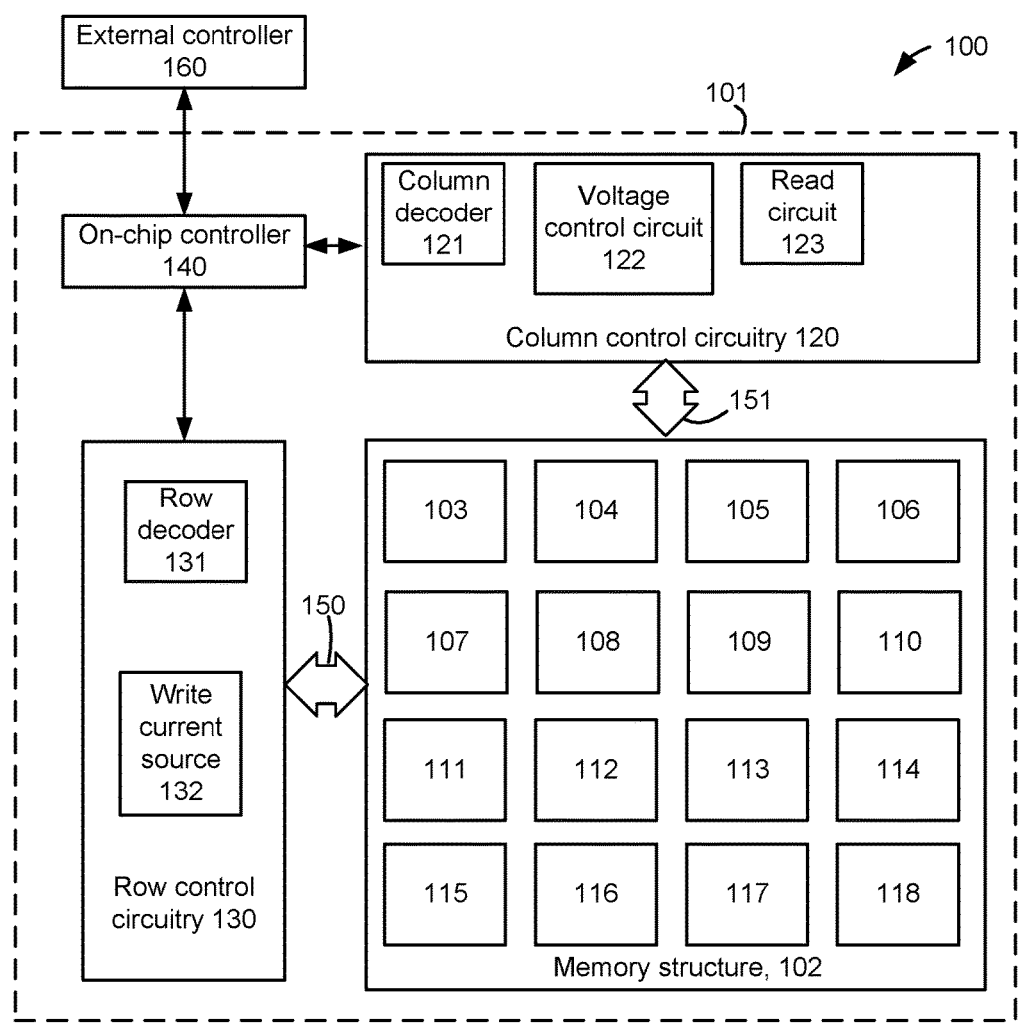
FIG. 1 is a block diagram of an example non-volatile memory device 100 comprising phase change memory cells.

Apparatuses and techniques are described for programming phase change memory cells.

Phase change memory cells, also referred to as resistance change memory cells, or resistive random access memory (RRAM) cells, include a phase change material which can be set in different phases or states which have different resistance levels. The state is maintained when no power is supplied so that the memory cells are non-volatile. Phase change materials include chalcogenides, carbon polymers, perovskites, and certain metal oxides (MeOx) and metal nitrides (MeN). In chalcogenides, a high-resistance state corresponds to an amorphous state, and a low-resistance state corresponds to a more ordered crystalline state. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. Ge2Sb2Te5 (germanium-antimony-tellurium) is one example of a chalcogenide material.

The conversion between states is generally achieved thermally, by applying a current to the memory cell to heat it. A conversion may be induced by increasing the temperature locally. Below 150° C., for example, both the amorphous state and the crystalline state are reasonably stable and may retain the bit state for ten years or more. Above 200° C., there is an increased rate of nucleation of the crystallites and, if the material is kept at the crystallization temperature for a sufficiently long time, it undergoes a phase change and becomes crystalline. To bring the chalcogenide back to the amorphous state, the temperature is raised above the melting temperature (approximately 600° C. for Ge2Sb2Te5, for example) and then the chalcogenide is cooled off rapidly. The crystallization and melting temperatures can be reached by causing a current to flow through a crystalline resistive element that heats the chalcogenic material by the Joule effect.

For example, the phase change material may initially be formed in a relatively low-resistance state. Upon application of a waveform with a sufficient voltage and current, the material switches to a stable high-resistance state if the trailing edge of the waveform is fast enough, e.g., having a duration of less than 10 nanoseconds (nsec.). This resistance switching is reversible such that subsequent application of a waveform with an appropriate current or voltage returns the material to a stable low-resistance state if the trailing edge of the waveform is slow enough, e.g., having a duration of more than 100 nsec. See, e.g., FIG. 8A at 90-190 μsec. This conversion can be repeated many times. A set operation may refer to switching the material from high to low resistance, while a reset operation may refer to switching the material from low to high resistance. The set and reset operations may both also be referred to as a write or program operations.

Examples of metal oxides and nitrides include Nickel Oxide (NiO), Niobium Oxide (Nb2O5), Titanium Dioxide (TiO2), Hafnium Oxide (HfO2), Aluminum Oxide (Al2O3), Magnesium Oxide (MgOx), Chromium Dioxide (CrO2), Vanadium Oxide (VO), Boron Nitride (BN), and Aluminum Nitride (AlN).

Phase change memory cells are of interest for use in nonvolatile memory arrays. One resistance state may correspond to a data "0," for example, while the other resistance state corresponds to a data "1." Some of these materials may have more than two stable resistance states. Moreover, in a memory cell (memory element), the phase change material can be in series with a selection element (also referred to as a steering element) which selectively limits the voltage across, and/or the current flow through, the phase change material. Examples of a selection element include a transistor, a diode and an ovonic threshold switch (OTS). A selection element may or may not allow current to flow in only one direction through the memory cell. If current is allowed by the selection element (selector) in either direction, the element may require a "turn-on" condition to a low resistance state and otherwise remain in a high resistance state. A transistor may require a control signal exceeding Vth to turn it on. A diode or OTS may require the voltage across the memory cell to exceed Vth; otherwise, the selection element remains "off" or in a relatively high resistance state. The selection element itself is not typically a resistance-change material and may not have memory of prior operations. Instead, the selection element allows a memory cell to be written to, and/or read from, without affecting the state of other memory cells in an array.

A write process typically involves a selected memory cell in an array of memory cells arranged in rows and columns. The write process involves biasing the selected memory cell via a selected word line and a selected bit line to provide a current through the selected memory cell. The word lines and bit lines are also referred as control lines. The unselected memory cells are biased to prevent a current flowing through them through unselect conditions that do not turn on their selection element. For example if the selection element is an OTS, an equal voltage can be provided on the unselected word line and bit line which are connected to an unselected memory cell. This results in no bias across the memory cell. In one approach, a transistor which is connected to each unselected word line and bit line is controlled to bias each unselected word line and bit line. For example, refer to FIG. 2A, in which word lines WL0-WL3 and bit lines BL0-BL3 are connected to memory cells in an array. The first transistors W0-W3 are used to bias word lines WL0-WL3, respectively, and the second transistors B0-B3 are used to bias bit lines BL0-BL3, respectively. If WL2 is a selected word line and WL0, WL1 and WL3 are unselected word lines, the transistors W0, W1 and W3 may be used to provide an isolation voltage such as 4 V on WL0, WL1 and WL3, respectively. Similarly, if BL0 is a selected bit line and BL1-BL3 are unselected bit lines, the transistors B1-B3 may be used to provide the same isolation voltage (4 V) on BL1-BL3, respectively. These transistors are provided in a conductive state to pass the 4 V to the corresponding control line.

However, the transistors of the selected word line WL1 and the selected bit line BL0 are biased differently. In particular, these transistors are provided in a non-conductive state to disconnect the 4 V voltage source from the corresponding control line. A transistor such as a MOSFET (metal-oxide-semiconductor field-effect transistor) can be provided in a conductive state by controlling the control gate voltage (Vcg) relative to the threshold voltage (Vth) of the transistor. In some configurations, the first transistors are n-channel MOSFETs and the second transistors are p-channel MOSFETs. For an n-channel MOSFET, the transistor is in a conductive state if Vcg−Vth>Vs, where Vs is the source voltage of the transistor. Since the source of an n-channel MOSFET is connected to the selected word line, the source voltage, and thus the selected word line voltage, are limited to being no lower than Vcg−Vth. The transistor is said to be in a clamp condition if the selected word line voltage falls to the clamp level of Vcg−Vth because the transistor or its well turns on to clamp the selected word line voltage at this minimum level, which is approximately Vcg−Vth, if the word line voltage is pulled down by the selected BL through the memory cell.

Similarly, for a p-channel MOSFET, the transistor is in a conductive state if Vcg−Vth<Vs. Since the source of a p-channel MOSFET is connected to the selected bit line, the source voltage, and thus the selected bit line voltage, are limited to being no higher than Vcg+Vth. The transistor is said to be in a clamp condition if the selected bit line voltage reaches the clamp level of Vcg+Vth because the transistor clamps the selected word line voltage at this maximum level. The selected word line voltage and selected bit line voltage may operate in a range above Vcg−Vth, and the selected bit line may operate below Vcg+Vth. However, during a set operation, for example, a current source may attempt to provide a ramp down current to the selected word line, where this results in a decreasing voltage on the selected word line and the selected bit line. The clamp condition of the transistors can prevent a write current source from providing a specific current versus time profile though the memory cell which is designed to heat the memory cell to cause a phase change to a different resistance level, as mentioned. As a result, the clamp condition can prevent a successful completion of the set operation.

Techniques provided herein address the above and other issues. In one approach, to avoid the decreasing voltage on the selected word line and the selected bit line, a voltage control circuit can be provided. The voltage control circuit is a circuit which can control the voltage on one terminal of a memory cell while a current source is connected to the opposing terminal and is providing a ramp down current in a write operation for the memory cell. For example, the voltage control circuit can cause the voltage on the one terminal to gradually increase during the write operation, which results in the voltage on the opposing terminal also gradually increasing or decreasing less than would be the case without the voltage control circuit. The voltage control circuit therefore counteracts a decrease in the voltage output of the current source with an increasing voltage. In an example embodiment, the voltage control circuit is connected to the one terminal via a respective control line such as a bit line, and the current source is connected to the opposing terminal via a respective control line such as a word line. However, the opposite approach may be used alternatively, where the voltage control circuit and the current source are connected to the word line and bit line, respectively.

The voltage control circuit can include a capacitor, for example, which accumulates charge on the bit line as current is supplied from the current source on the word line. As the charge accumulates, the voltages of the selected bit line and the selected word lines are moderated and kept within their desired range of Vcg−Vth to Vcg+Vth. For example, the voltages can gradually increase while the current output of the current source is reduced. This approach advantageously may consume less power compared to using a voltage driver, discussed below, and allows a gradual and continuous increase of the bit line voltage throughout all or most of the write operation.

In another possible option, the voltage control circuit can include a voltage driver which provides a ramp up or increasing voltage on the bit line at a prescribed ramp up rate. This approach advantageously allows the bit line voltage to be increased in a predetermined manner, and allows for an adjustment in the rate of increase if desired.

Various other features and benefits are described below.

FIG. 1 is a block diagram of an example non-volatile memory device 100 comprising phase change memory cells. The memory device includes a memory die 101 (e.g., a memory chip) with an on-chip controller 140 which communicates with an external controller 160 such as in a host device. The external controller may be located off the memory chip. Or the functions on the external controller 160 may be shifted into the on-chip controller 140 to eliminate the extra package in a volumetric sensitive applications such as mobile. For example, the external controller may transmit read and write commands to the on-chip controller with addresses of corresponding memory cells. The on-chip controller 140 may provide read data to the external controller in response to a read command. The on-chip controller may include a random access memory (RAM) for temporarily storing data and associated information. Commands, status signals and addresses of data being read or programmed are exchanged between the controller 140 and the host. The memory device can operate with various host systems such as personal computers (PCs), laptops and other portable computers, cellular telephones, personal digital assistants (PDAs), digital still cameras, digital movie cameras and portable audio players. The host typically connects to the memory device using a built-in receptacle (for receiving a memory card or flash drive that comprises the memory device) or by a wired or wireless path. Alternatively, the memory device may be built into the host system.

The phase change memory cells may be arranged in groups referred to as tiles 103-118 in a memory structure 102 which comprises one or more memory arrays. Typically, one tile is selected at a time for a read or write operation. The memory structure communicates with row control circuitry 130 and column control circuitry 120 via paths 150 and 151, respectively. In a selected tile, the row control circuitry is configured to provide voltages and currents on the word lines or first control lines while the column control circuitry is configured to provide, and sense, voltages and currents on, the bit lines or second control lines. The row control circuitry includes a row decoder 131 and a write current source 132. The row decoder can be used to select and unselect word lines in a tile during a read or write operation. The write current source can be used to provide a current through a selected memory cell which is being written. The column control circuitry includes a column decoder 121, a voltage control circuit 122 (a circuit), and a read circuit 123. The column decoder 121 can be used to select and unselect bit lines in a tile during a read or write operation. The voltage control circuit 122 can be used to moderate, or regulate, the voltages of the selected bit line and the selected word lines during a set operation, as mentioned above. This regulation can involve keeping the voltages above a minimum level, below a maximum level or within a specified range. The read circuit can be used to sense the state of a selected memory cell in a read operation such as by determining a resistance of the memory cell. The read circuit may include sense amplifiers, for example.

Although each of the memory cells in the memory structure may be individually addressed to be programmed or read, it is also possible to program or read sets of memory cells in parallel. For example, one row of memory cells in a tile may be programmed and read in parallel. The number of memory cells programmed or read in parallel depends on the number of memory cells connected to the selected word line. In some structures, the word lines may be segmented so that only a portion of the total number of memory cells connected along their length may be addressed for parallel operation, namely the memory cells connected to a selected one of the segments. In some structures, the number of memory cells programmed in one operation may be less than the total number of memory cells connected to the selected word line.

Previously programmed memory cells whose data have become obsolete may be addressed and re-programmed from the states in which they were previously programmed. The starting states can differ among the memory cells being re-programmed in parallel. In some cases, a group of memory cells is reset to a common state before they are re-programmed. For example, the memory cells of each tile may be simultaneously reset to a common state, e.g., a low or high resistance state, in preparation for subsequently programming them. The individual tiles of memory cells may be further divided into a plurality of pages of storage elements, wherein the memory cells of a page are programmed or read together.

The memory structure can be 2D or 3D. The memory structure may comprise a monolithic 3D memory structure in which multiple memory levels are formed above a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Figure 2A:
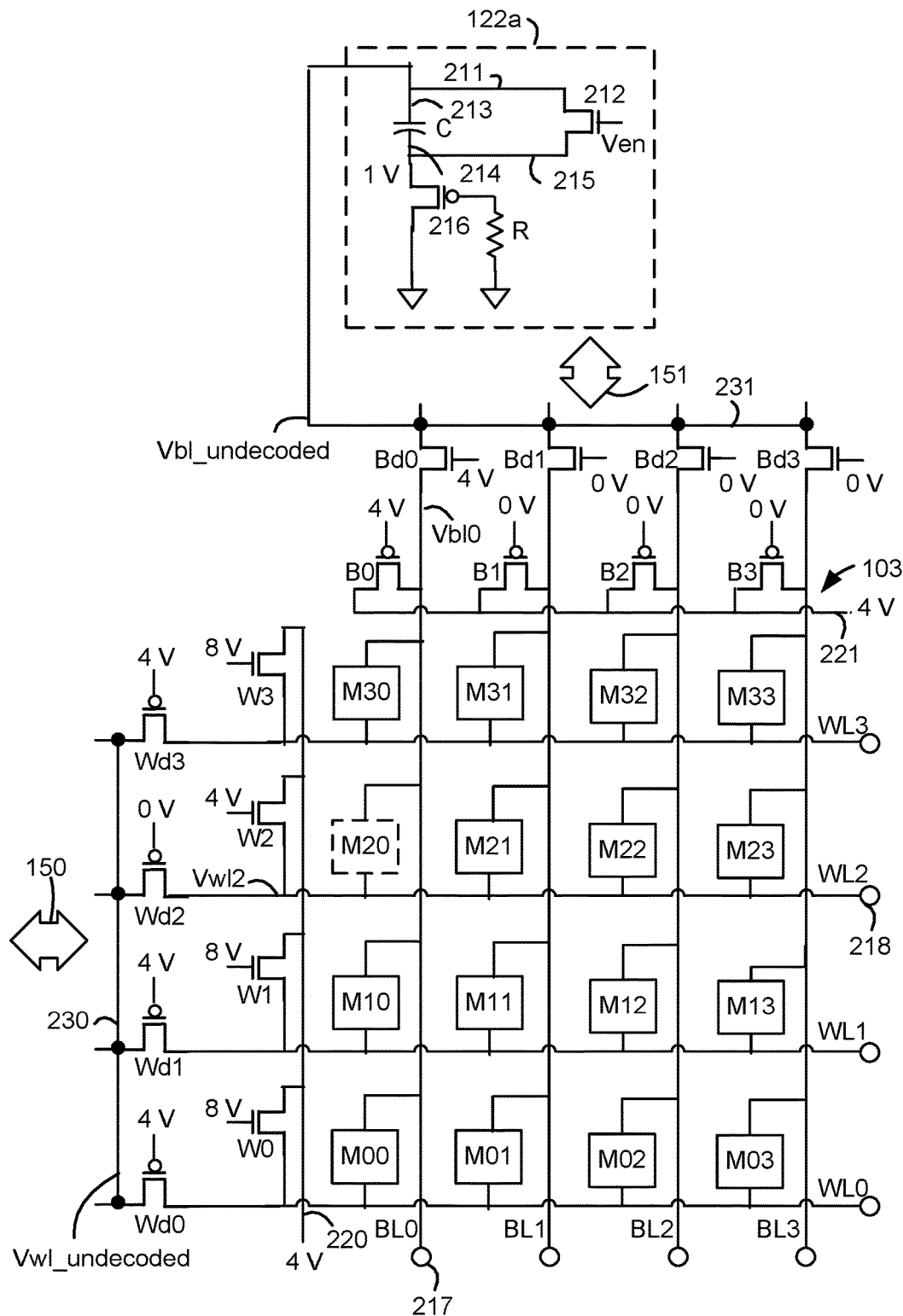
FIG. 2A depicts an example of the tile 103 and an embodiment of the voltage control circuit 122 of FIG. 1, where the voltage control circuit 122a comprises a capacitor and is connected to example bit lines BL0-BL3.

FIG. 2A depicts an example of the tile 103 and an embodiment of the voltage control circuit 122 of FIG. 1, where the voltage control circuit 122a comprises a capacitor and is connected to example bit lines BL0-BL3. The voltage control circuit advantageously can be shared by the different bit lines or other control lines through use of decoder transistors Bd0-Bd3 and control signals supplied to their control gates. The bit line decoder transistors can direct a control voltage and current to a selected bit line. The tile 103 includes sixteen example memory cells arranged in four rows and four columns, where each row is connected to a respective word line and each column is connected to a respective bit line. Each memory cell may be a two-terminal device in which one terminal is connected to a first control line (e.g., word line) and another terminal is connected to a second control line (e.g., bit line). The control lines may be metal or doped silicon, for instance.

For example, memory cells M00, M01, M02 and M03 are connected to WL0 and to bit lines B0, B1, B2 and B3, respectively, memory cells M10, M11, M12 and M13 are connected to WL1 and to bit lines B0, B1, B2 and B3, respectively, memory cells M20, M21, M22 and M23 are connected to WL2 and to bit lines B0, B1, B2 and B3, respectively, and memory cells M30, M31, M32 and M33 are connected to WL3 and to bit lines B0, B1, B2 and B3, respectively. M20, connected to WL2 and BL0, is an example selected memory cell as denoted by the dashed line.

Each bit line and word line can be terminated by an open circuit as depicted by the circular terminals including example terminals 217 and 218 for BL0 and WL2, respectively, in one approach.

A word line decoder transistor Wd0-Wd3 is connected to each word line to select or unselect the respective word line. Specifically, decoder transistors Wd0-Wd3 are connected serially to WL0-WL3, respectively. Similarly, decoder transistors Bd0-Bd3 are connected serially to BL0-BL3, respectively, to select or unselect the respective bit line. In one approach, the word line decoder transistors are p-channel MOSFETs and the bit line decoder transistors an n-channel MOSFETs. As a result, with the example selected memory cell M20, the decoder transistor Wd2 is selected, or provided in a conductive state, by applying a low control gate voltage such as 0 V, while the decoder transistors Wd0, Wd1 and Wd3 are unselected, or provided in a non-conductive state, by applying a higher control gate voltage such as 4 V. The bit line decoder transistor Bd2 is also selected, or provided in a conductive state, by applying a high control gate voltage such as 4 V, while the decoder transistors Bd1-Bd3 are unselected, or provided in a non-conductive state, by applying a low control gate voltage such as 0 V.

The sources of the transistors Wd0-Wd3 can be connected to one another via a path 230 which has a voltage Vwl_undecoded. The voltage at the drain of the transistor Wd2 of the selected word line WL2 is Vwl2. The drains of the transistors Bd0-Bd3 can be connected to one another via a path 231 which has a voltage Vbl_undecoded. The voltage at the source of the transistor Bd0 of the selected bit line BL0 is Vbl0.

Each word line WL0-WL3 is also connected in parallel to a first transistor W0-W3, respectively, which can be provided in a conductive state to pass an isolation voltage, e.g., 4 V, to a word line which is unselected. The first transistors may be n-channel MOSFETs, in one approach, and have a source connected to a common voltage on a path 220. For the selected word line, WL2, the first transistor W2 is provided in a non-conductive state to disconnect the isolation voltage from the word line. Similarly, each bit line BL0-BL3 is connected to a second transistor B0-B3, respectively, which can be provided in a conductive state to pass the isolation voltage, e.g., 4 V, to a bit line which is unselected. The second transistors may be p-channel MOSFETs, in one approach, and have a drain connected to a common voltage on a path 221.

The first and second transistors are connected in parallel with the word lines and bit lines, respectively, while the word line and bit decoder transistors are connected serially with the word lines and bit lines, respectively.

For the selected bit line, BL0, the second transistor B0 is provided in a non-conductive state to block the isolation voltage from the bit line. In one approach, the unselected memory cells which are connected to both unselected word lines and unselected bit lines can be biased at both of their terminals with an equal positive voltage (an isolation voltage) during a write operation to prevent the unselected memory cells from being written. An unselected memory cell is a memory cell which is not selected for a read or write operation. A selected memory cell is a memory cell which is selected for a read or write operation. A subset of the unselected memory cells (e.g., M21-M23) will be connected to a selected word line (WL2) and an unselected bit line (BL1-BL3), while other unselected memory cells (M00, M10, M30) are connected to an unselected word line (WL0, WL1, WL3) and a selected bit line (BL0). During the write current in the selected memory cell, the isolation voltage is sufficient to prevent a phase change in the unselected memory cells. The Vth of the OTS or other selection element should be set based on conflicting criterion. Specifically, the Vth of the selection element should exceed the isolation voltage of a partially selected memory cell in a selected row and unselected column, or in an unselected row and a selected column. However, the Vth of the selection element should be low enough so that a selected memory cell has its selection element turned on if the memory element is in the lower resistance state (in which case the Vth of the memory cell is lower). Further, the Vth of the selection element and the Vth of the memory cell should be less than the write voltage even if the memory cell is in a higher resistance state with a relatively higher Vth.

The selected memory cell, in contrast, is biased by a word line voltage which passes through the decoder transistor Wd2 and by a bit line voltage which passes through the decoder transistor Bd0.

The first transistors can be provided in a conductive or non-conductive state by the row control circuitry setting appropriate control gate voltages (Vcg). For example, Vcg=8 V provides the transistors W0, W1 and W3 in a conductive state, and Vcg=4 V provides the transistor W2 in a non-conductive state. Similarly, the second transistors can be provided in a conductive or non-conductive state by the column control circuitry setting appropriate control gate voltages (Vcg). For example, Vcg=0 V provides the transistors B1-B3 in a conductive state, and Vcg=4 V provides the transistor B0 in a non-conductive state.

In one approach, the voltage on the common paths 220 and 221 is a midpoint (Vmid) within a range of a power supply voltage for the chip. For example, with a range of 0-8 V, Vmid=4 V. Further, a lower half of the range, 0-4 V, may be used to set Vcg for the transistors B0-B3, while an upper half of the range, 4-8 V, may be used to set Vcg for the transistors W0-W3. This allows the n-channel transistors W0-W3 and the p-channel transistors to be controlled using a same voltage swing, e.g., 0-4 V. The stress on the transistors is also limited by using only half of the range of the power supply voltage. Any of transistors B0-B3 and W0-W4 which are connected to unselected control lines are turned on to connect the unselected control lines to an unselect or isolation voltage, e.g., VMID.

The bit lines BL0-BL3 can be connected to a voltage control circuit 122a via bit line decoder transistors Bd0-Bd3, respectively, which can be n-channel MOSFETs, in one approach. During a set operation, when a current is supplied to the selected word line, the selected bit line can be connected to the voltage control circuit by providing the respective decoder transistor in a conductive state. For example, with WL2 and BL0 as the selected word line and bit line, respectively, BL0 can be connected to the voltage control circuit by providing Bd0 in a conductive state, e.g., by applying VMID to its control gate. Similarly, WL2 can be connected to its control circuit, e.g., to the current source, by providing Wd2 in a conductive state, e.g., by applying 0 V to its control gate.

A set of second transistors B0-B3 are connected to the bit lines BL0-BL3, respectively, to pass an isolation or unselect voltage to the bit lines or disconnect the isolation voltage from the bit line. For a selected bit line such as BL0 in this example, the respective second transistor B0 is provided in a non-conductive state by providing a high voltage such as 4 V on the control gate. This disconnects the isolation voltage on the path 221 from reaching BL0. For the unselected bit lines such as BL1-BL3, the respective second transistors B1-B3 are provided in a conductive state by providing a low voltage such as 0 V on the control gate. This connects the isolation voltage on the path 221 to BL1-BL3, respectively, and to unselected memory cells connected to those bit lines.

Voltages for controlling the transistors Wd0-Wd3 and W0-W3 can be provided by the row control circuitry, and voltages for controlling the transistors Bd0-Bd3 and B0-B3 can be provided by the column control circuitry, for example.

The voltage control circuit 122a can include a capacitor C which accumulates charge on the selected bit line during a set operation, to moderate a voltage on the bit line and therefore on the selected word line as well through the selected memory cell, which is interconnected to both the selected bit line and the selected word line. The bit line and word line are more strongly coupled to one another when the memory cell is conductive and passing current. The voltage control circuit is provided instead of a fixed voltage or current source, for example, which would not have the same effect. The capacitor is connected to ground by a transistor 216, such as a p-channel MOSFET, which has its control gate connected to ground via a resistor R. The capacitor has one side 213 and another side 214. Additionally, a switch such as a transistor 212 (e.g., an n-channel MOSFET) can connect the opposing sides of the capacitor to one another via paths 211 and 215, when the transistor is in a conductive state. This short circuits the capacitor to provide a starting voltage on the bit line. The starting voltage can be stored in the capacitor at the start of the write operation or at another time.

When the transistor is in a non-conductive state, the one side 213 of the capacitor is connected to BL0 in series via the path 231 and accumulates charge from the selected bit line during a set operation via the path 231 via current passing through the memory cell from the selected word line. Raising the bit line voltage prevents the first and second transistors from entering a clamp condition as the word line voltage declines during the trailing edge ramp used to write the selected memory cell into the lower resistance state. This raising of the bit line voltage helps ensure that the set operation is successful. Specifically, during the set operation, the write current source 132 (FIG. 1) provides a current on the selected word line. This current passes through the selected memory cell and to the selected bit line and the voltage control circuit. As the capacitor accumulates charge, the voltage on the one side of the capacitor increases, thereby also increasing Vbl0. See FIG. 8A to 9A for further details. Testing or simulation can indicate an appropriate capacitor size.

At other times, when the transistor 212 is in a conductive state, transistor 212 removes the voltage control circuit from the circuit and allows a voltage to be provided on the bit line from the column control circuitry 120 via the path 151. The transistor 212 can be controlled by a control gate voltage Ven (enable voltage). For example, a high value of Ven such as 4 V can provide the transistor in a conductive state while a low value such as 0 V can provide the transistor in a non-conductive state. Vcg can be provided from the on-chip controller, for example. The side 214 of the capacitor may be at a voltage such as 1 V above the minimum power supply voltage, which is 0 V or ground in this example. If the minimum power supply voltage was −4 V, for example, the side 214 of the capacitor could be at a voltage such as −3 V.

In the configuration depicted, the side 214 of the capacitor is at a voltage which is above ground by the sum of a) the Vth of the transistor 216 and b) Von. Von is a voltage margin above Vth which supports the current flowing through the transistor; e.g., the transistor 216 is in a diode-like operating mode. In another possible approach, the transistor 216 is replaced with a short circuit and the side 214 of the capacitor is at ground.

In an alternative approach, the write current is provided on a selected bit line and the voltage control circuit is provided on the selected word line.

Advantageously, the capacitor does not increase power consumption of the memory device since it is charged by current passing through the memory cell. It has been found that the set operation is sensitive to a discontinuity in Icell and the capacitive voltage control circuit can help avoid such discontinuities by raising the bit line voltage so that W2 does not clamp the voltage of WL2 as the current in WL2 decreases during the trailing edge write current ramp, e.g., from 90-190 nsec. in FIG. 8A.

The capacitor is an example of a charge-storing device which is configured to store charge from the path 231 when the memory cell M20 is selected for a write operation and the decoder Bd0 is in a conductive state. A related apparatus can include: a charge-storing device connected to a decoder via a path, where the decoder is connected to a terminal of a memory cell. The apparatus also includes circuitry configured to allow the charge-storing device to store charge from the path when the memory cell is selected for a write operation and the decoder is in a conductive state. The circuitry also prevents the charge-storing device from storing charge from the path when the memory cell is unselected for the write operation and the decoder is in a non-conductive state. The apparatus also includes a current source connected to another terminal of the memory cells and configured to provide a current through the memory cell during the write operation. For example, the circuitry may include the column control circuitry 120 and the on-chip controller 140.

Figure 2B:
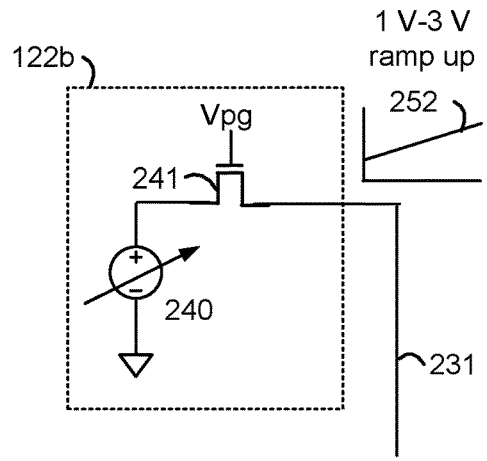
FIG. 2B depicts another embodiment of the voltage control circuit 122 of FIG. 1, where the voltage control circuit 122b comprises a voltage driver and is connected to the example bit lines BL0-BL3.

Additionally, FIGS. 1, 2A and 2B provide an example of a system comprising: a controller and a memory die connected to the controller. The memory die comprises a cross-point array (102) of phase change memory cells, where the phase change memory cells comprise first and second terminals. The memory die also comprises a set of first control lines (e.g., WL0-WL3 or BL0-BL3) connected to the first terminals, a set of second control lines (e.g., BL0-BL3 or WL0-WL3) connected to the second terminals, a set of first decoders (e.g., Wd0-Wd3 or Bd0-Bd3) connected to the set of first control lines, and a set of second decoders (e.g., Bd0-Bd3 or Wd0-Wd3) connected to the set of second control lines. The memory die also comprises a current source 132 connected to the set of first decoders, and a voltage control circuit 122, 122a, 122b connected to the set of second decoders and configured to cause a voltage of a selected first control line among the set of first control lines and a voltage of a selected second control line among the set of second control lines to continuously increase during at least a portion of a write operation for a selected memory cell. In one approach, the continuous increase is during a majority of a time period of a write operation in which a decreasing current is applied. For example, this could be a majority of the time period from 90-190 nsec. in FIG. 8A. The majority can be more than 50% of 100 nsec. or more than 50 nsec. The majority of the time period can be in one continuous time period or based on a sum of different time periods.

The apparatus further includes a set of first transistors (e.g., W0-W3 or B0-B3) connected in parallel to the set of first control lines, between the set of first decoders and the cross-point array, and a set of second transistors (e.g., B0-B3 or W0-W3) connected in parallel to the set of second control lines, between the set of second decoders and the cross-point array. One of the first transistors (e.g., W2 or B0) is connected to a selected first control line (e.g., WL2 or BL0). Further, a selected phase change memory cell (e.g., M20) is connected to the selected first control line. The voltage control circuit is configured to keep a voltage on the selected first control line above a specified level to avoid a clamp condition of the one of the first transistors during a write operation of the selected phase change memory cell.

Furthermore, one of the second transistors (e.g., B0) is connected to a selected second control line (e.g., BL0); the selected phase change memory cell is connected to the selected second control line; and the voltage control circuit is configured to keep a voltage on the selected second control line below a specified level to avoid a clamp condition of the one of the second transistors during the write operation.

FIG. 2B depicts another embodiment of the voltage control circuit 122 of FIG. 1, where the voltage control circuit 122b comprises a voltage driver and is connected to the example bit lines BL0-BL3. Instead of using a capacitive element to moderate and increase the selected bit line voltage during a set operation, the selected bit can be driven with an increasing ramp voltage to achieve a similar effect. In this case, a voltage control circuit 122b includes a variable voltage source 240, e.g., a variable voltage driver, in which one side is connected to ground and the other side is connected to a transistor 241 such as an n-channel MOSFET. The voltage source may be a direct current (DC) voltage source such as a charge pump. The transistor can be provided in a conductive state by setting Vpg (pass gate) to a high voltage such as 4 V. This connects the voltage source to the path 231 and to the selected bit line. A plot 252 shows that the voltage of the voltage source may ramp up from an initial level to a final level in a predetermined time period and at a prescribed rate, for example, during the set operation. The initial level can be 1 V while the final level is 2-3 V, for example. The predetermined time period can be the time period in which the current from the current source is ramping down. For example, this is the time period from 90-190 nsec. in FIG. 8A in which the current Icell ramps down from 70 to 30 μA over a duration of 100 nsec. Testing can indicate an appropriate starting level, final level and ramp rate for the plot 252. Vpg can be set by the column control circuitry, for example.

Although the voltage driver consumes power, it provides the flexibility to set the starting level, final level and ramp rate.

Figure 3A:
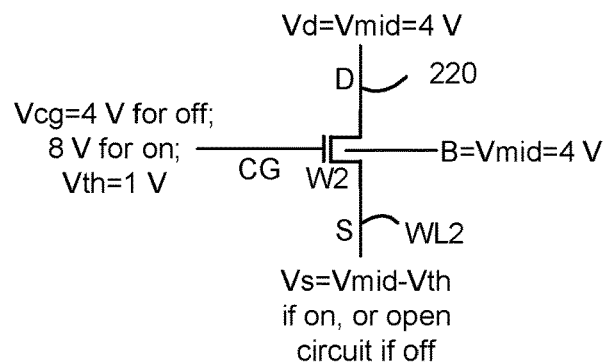
FIG. 3A depicts example voltages applied to the first transistor W2 in FIG. 2A in a set operation.

FIG. 3A depicts example voltages applied to the first transistor W2 in FIG. 2A in a set operation. The drain (D) of the transistor is connected to a midpoint voltage, Vmid=4 V, for example, and to the path 220. The control gate (CG) is connected to a voltage Vcg, which may be 4 V to place the transistor in the off or non-conductive state and 8 V to place the transistor in the on or conductive state. A body or well of the transistor may be connected to Vmid=4 V, for example. With these voltages, the source (S) is at a voltage of Vs=Vmid−Vth if the transistor is on, or the source is an open circuit if the transistor is off. As an example, assume the threshold voltage of the transistor, Vth, is 1 V. As mentioned, the transistor can enter a clamp condition in which it attempts to limit Vs to a minimum level of Vmid-Vth or 4-1=3 V. Since the source is connected to the word line WL2, this can also limit Vwl2 to this minimum level. In one approach, the voltage control circuit keeps Vwl2 above this minimum level during a critical time period in which the set operation occurs. This can be during a portion of the trailing edge of the ramp down current in which the memory cell is crystalized. The ramp down current is a decreasing current provided on WL2 from the write current source. Keeping Vwl2 above the minimum level allows the set operation to be successfully completed.

Figure 3B:
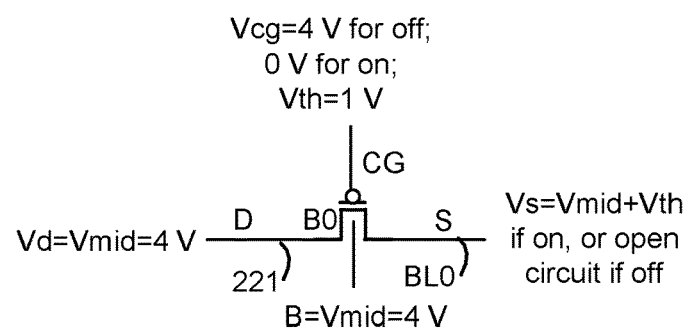
FIG. 3B depicts example voltages applied to the second transistor B0 in FIG. 2A in a set operation.

FIG. 3B depicts example voltages applied to the second transistor B0 in FIG. 2A in a set operation. The drain (D) of the transistor is connected to Vmid=4 V, for example, and to the path 221. The CG is connected to a voltage Vcg, which may be 4 V to place the transistor in the off or non-conductive state for a selected bit line and 0 V to place the transistor in the on or conductive state for a deselected bit line. A body or well of the transistor may be connected to Vmid=4 V, for example. With these voltages, the drain (D) may be at a voltage of Vd=Vmid+Vth where the transistor is on, or an open circuit if the transistor is off with the drain closer to Vmid. As an example, assume Vth=1 V. The transistor can enter a clamp condition in which it attempts to limit Vd to a maximum level of Vmid+Vth or 4+1=5 V. Since the drain is connected to the bit line BL0, this can also limit Vbl0 to this maximum level. The voltage control circuit keeps Vbl0 below this maximum level during the time period in which the set operation occurs, while a current is provided on WL2 from the write current source, thus allowing the set operation to be successfully completed.

FIG. 4A depicts an example triple-well configuration of the example first transistor W2 of the selected word line WL2 and the second transistor B0 of the selected bit line BL0 of FIG. 2A. A triple-well configuration allows the transistors to be formed in a well in the substrate which is different than a well in which the memory structure 102 (FIG. 1) is formed. This allows the transistors to be electrically isolated from the substrate voltage so that they can be biased independently. In the example configuration, the transistors W2 and B0 are formed on a common p− (weakly p type) substrate 430 The WL2 transistor W2 includes an oxide layer 403 on the substrate and a control gate 404 which receives a voltage Vcg on top of the oxide layer. The WL2 transistor W2 is formed in a p well 408 (a p type well) which is within an n well 409 (an n type well) which in turn is within another p well 410. Within the p well 408, an n+ diffusion region 402 is a source of the transistor and has a voltage Vs/Vwl2, an n+ diffusion region 405 is a drain of the transistor and has a voltage Vd, and a p+ diffusion region 406 is a contact to a body of the transistor and has a voltage Vb. Additionally, an n+ diffusion region 407 is a contact to the n well 409 and has a positive voltage Vdd, e.g., 2 V, and a p+ diffusion region 401 is a contact to the p well 410 and has a ground voltage Vss, for example.

The BL0 transistor B0 includes an oxide layer 421 on the substrate and a control gate 422 which receives a voltage Vcg on top of the oxide layer. The BL0 transistor B0 is formed in an n well 427 which in turn is within a p well 428. Within the n well 427, a p+ diffusion region 420 is a source of the transistor and has a voltage Vs/Vbl0, a p+ diffusion region 423 is a drain of the transistor and has a voltage Vd, and an n+ diffusion region 424 is a contact to a body of the transistor and has a voltage Vb. An n+ diffusion region 426 is a contact to the p well 428 and has a ground voltage Vss, for example.

FIG. 4B depicts another example triple-well configuration of the example first transistor W2 of the selected word line WL2 and the second transistor B0 of the selected bit line BL0 of FIG. 2A. In this case, the p-wells 410 and 428 are omitted. Instead, the n-wells 409 and 427 are formed directly in the p− substrate 430. The like numbered diffusion regions and other components operate as discussed in connection with FIG. 4A.

In the above triple-well configurations, it is useful to control the n-channel MOSFET using a top half of a range of a power supply voltage, e.g., 4-8 V and to control the p-channel MOSFET using a bottom half of the range, e.g., 0-4 V. This example assumes the range of the power supply voltage is 0-8 V, where the midpoint is 4 V. The different types of transistors may be set in a desired conductive or non-conductive state while reducing the maximum voltage across the oxide layer of the transistors to one half of the range. This helps avoid damage to the oxide layer. However, as mentioned, it can result in a situation in which the voltages of the transistors on the WL should be maintained above Vmid-Vth (referring to the Vth of W2) and the voltages of the transistors on the BL should be maintained below Vmid+Vth (referring to the Vth of B0) during a set operation in the memory device. The advantages of the triple-well configuration with half write voltages can be obtained while allowing a successful completion of a set operation using the techniques provided herein.

Figure 5A:
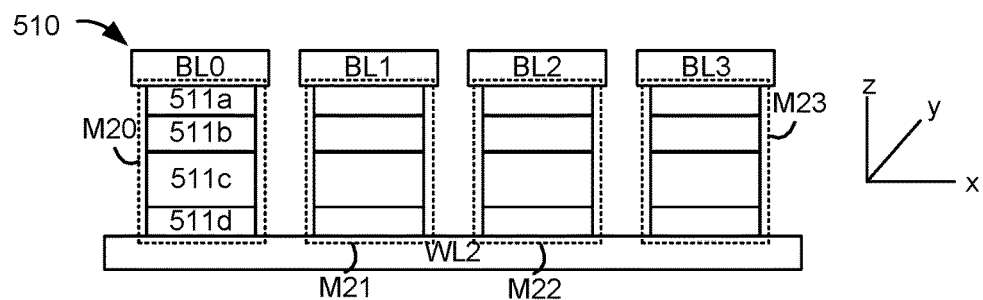
FIG. 5A depicts an example one-level configuration of memory cells in the memory structure 102 of FIG. 1.

FIG. 5A depicts an example one-level configuration of memory cells in the memory structure 102 of FIG. 1. An example word line WL2 is depicted with a row 510 of memory cells M20-M23 and bit lines BL0-BL3, consistent with FIG. 2A. The word line extends in an x direction, while the bit lines extend in the perpendicular y direction. Additional rows of memory cells are provided in front of and behind the depicted row. Each memory cell includes, e.g., a bottom electrode 511d, a phase change material 511c, a top electrode 511b and a selection element 511a. In one option, the selection element is at the bottom of the stack of layers rather than at the top. The selection element has the ability to conduct current when a sufficiently high voltage is provided across it, such as when the memory cell is selected for a set operation, and to block current when the voltage is removed, such as when the memory cell is unselected and an isolation voltage is applied to either or both sides of the memory cell.

In this example, the bottom electrode 511d is one terminal, e.g., a first terminal, of the memory cell M20 and the selection element 511a is another terminal, e.g., a second terminal, of the memory cell. In some versions of the memory cell, additional series components or electrodes such as carbon may added on either or both sides of the memory cell or selection element. And, an additional series electrode may be added above the selection element 511a.

Figure 5B:
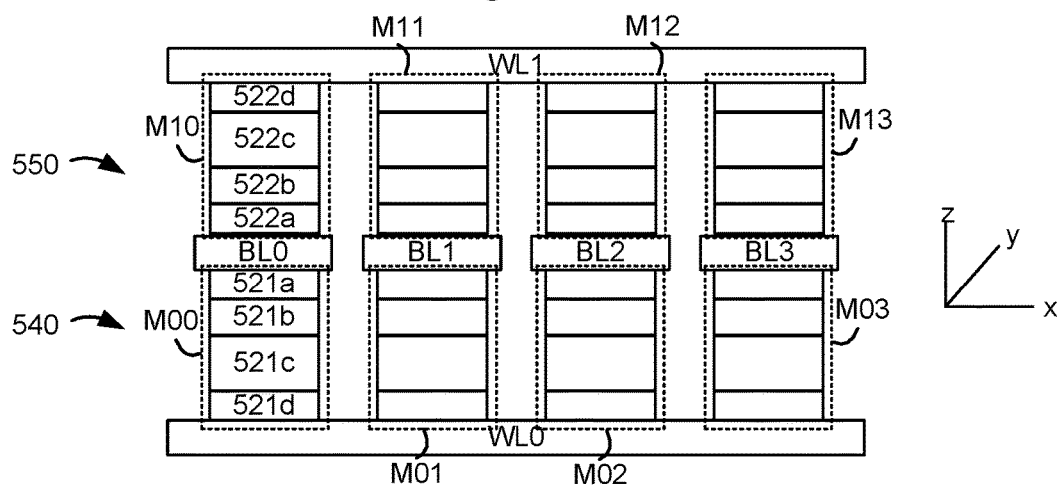
FIG. 5B depicts an example two-level configuration of memory cells in the memory structure 102 of FIG. 1.

FIG. 5B depicts an example two-level configuration of memory cells in the memory structure 102 of FIG. 1. Rows of memory cells may be arranged in two or more levels to increase the density of the memory structure. An example word line WL0 is depicted with a row 540 of memory cells M00-M03, and another example word line WL1 is depicted with a row 550 of memory cells M10-M13. The bit lines BL0-BL3 can be arranged so they are shared by the rows 540 and 550 to further reduce the size of the memory structure. The memory cell M00 includes a bottom electrode 521d, a phase change material 521c, a top electrode 521b and a selection element 521a. The memory cell M10 has an inverted structure relative to M00 and includes a selection element 522a at the bottom, followed by a bottom electrode 522b, a phase change material 522c, and a top electrode 522d.

In this example, the bottom electrode 521d is one terminal, e.g., a first terminal, of the memory cell M00 and the selection element 521a is another terminal, e.g., a second terminal, of the memory cell. Also, the top electrode 522d is one terminal, e.g., a first terminal, of the memory cell M10 and the selection element 522a is another terminal, e.g., a second terminal, of the memory cell.

Figure 6A:
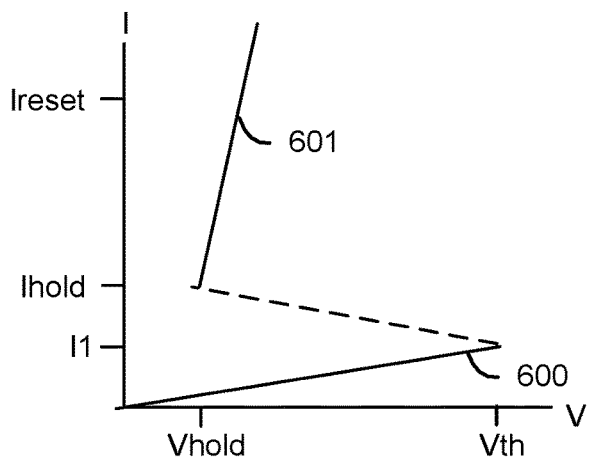
FIG. 6A depicts an example plot of current versus voltage for a phase change memory element in the memory structure 102 of FIG. 1.
Figure 6B:
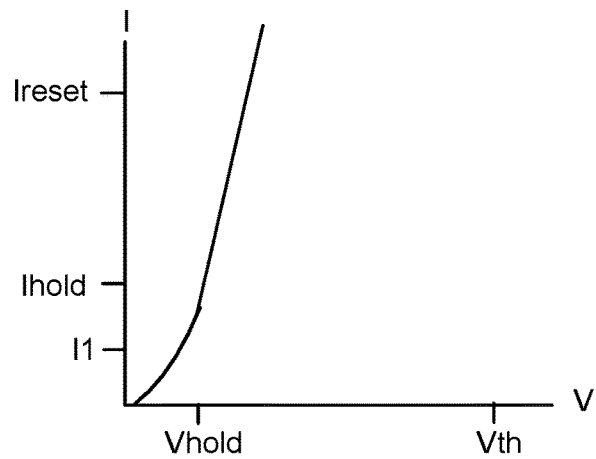
FIG. 6B depicts an example plot of current versus voltage for a phase change memory element in the set resistance state in the memory structure 102 of FIG. 1.

FIG. 6A depicts an example plot of current (I) versus voltage (V) for a phase change memory element in the memory structure 102 of FIG. 1. As mentioned, a set operation involves a transition from a high resistance state to a low resistance state. The plot is relevant to a chalcogenide-based phase change memory element. FIGS. 6A and 6B depict its characteristics in the higher and lower resistance states, respectively. In the set operation, the voltage across the memory element is increased as a current is applied. The plot includes a first branch 600 in which the memory element is in the high resistance state. As a result, the current passing through the memory element increases only slightly with an increasing voltage across the memory cell. When the voltage reaches or exceeds the threshold voltage Vth, where the current reaches a level II, the I-V characteristic switches abruptly to that depicted by a second branch 601. The memory cell now operates in a lower dynamic resistance state and becomes highly conductive so that a small change in voltage results in a large change in current. If a sufficient amount of energy, represented by the current Ireset, is applied to the memory cell, the memory cell will successfully transition from the high resistance or reset state to the low resistance or set state at the conclusion of the write cycle. The resulting state is determined by whether the trailing edge of the current turn-off is faster or slower, respectively, to leave the memory element in the higher reset resistance state or lower set resistance state; e.g., if the edge is respectively faster than 10 nsec. or slower than 100 nsec. The selection element has a characteristic like that in FIG. 6A without memory.

However, if the current is brought down below the holding current, Ihold (corresponding to a holding voltage Vhold) too soon, the I-V characteristic may return to that of the first branch 600, where the memory cell returns to the high resistance state. In an example embodiment, Vth may be about 4 V while Vhold may be around 0.5 V. In addition, the memory cell may have a very large resistance such as 200 kOhm in the high resistance state and a low resistance such as 1 kOhm in the low resistance state. These resistance values depend on factors such as the size of the contact to the phase change material and the composition of the phase change material.

The set process may involve applying a relatively long decreasing current to the memory cell as discussed further in connection with FIG. 8A to 9B.

FIG. 6B depicts an example plot of current versus voltage for a phase change memory element in the set resistance state in the memory structure 102 of FIG. 1. A reset operation involves a transition from a low resistance state to a high resistance state. This is accomplished by applying a relatively short, high amplitude current pulse (with an amplitude Ireset) to the memory cell. Ireset may be higher in amplitude than the current used in the set operation. When the heat generated by the current is sufficient to transition the memory cell to the high resistance state, the I-V characteristic is then represented by the plot 600 in FIG. 6A. A current level in the memory element should not exceed about 10-20% of Ireset at other times to avoid an inadvertent reset operation.

FIG. 7A depicts a flowchart of an example process for performing a set operation for a selected memory cell. Step 700 begins the set operation for the selected memory cell. Step 701 includes setting decoder transistors of a selected word line (WL) and a selected bit line (BL) in a conductive state, and setting decoder transistors of unselected word lines and bit lines in a non-conductive state. For example, in FIG. 2A, this can involve setting the decoder transistor Wd2 of a selected word line WL2 and a decoder transistor Bd0 of a selected bit line (BL0) in a conductive state, and setting decoder transistors Wd0, Wd1 and Wd3 of the unselected word lines WL0, WL1 and WL3, respectively, and decoder transistors Bd1-Bd3 of the unselected bit lines BL1-BL3, respectively, in a non-conductive state. Also, as explained in connection with steps 702 and 703, transistors W0, W1, W3 and B1-B3 are set in a conductive state and transistor W2 and B0 are set in a non-conductive state.

Step 702 includes setting a first transistor connected to the selected WL in parallel and a second transistor connected to the selected BL in parallel in a non-conductive state to disconnect an isolation voltage (Vmid) from the selected word line and the selected bit line, respectively. For example, in FIG. 2A, this can involve setting a first transistor W2 connected to the selected word line WL2 and a second transistor B0 connected to the selected bit line BL0 in a non-conductive state to disconnect an isolation voltage (Vmid) from WL2 and BL0, respectively.

Step 703 includes setting first transistors connected to the unselected WLs and second transistors connected to the unselected BLs in a conductive state to connect the isolation voltage to the unselected WLs and the unselected BLs, respectively. For example, in FIG. 2A, this can involve setting first transistors W0, W1 and W3 connected to the unselected WLs WL0, WL1 and WL3, respectively, and second transistors B1-B3 connected to the unselected BLs BL1-BL3, respectively, in a conductive state. Step 704 includes providing a ramp down current to the selected word line, e.g., using the write current source 132 of FIG. 1. This can involve, e.g., providing a current greater than or equal to Ireset to the selected memory cell and ramping down this current. See also FIG. 8A to 9B.

Step 705 includes connecting the voltage control circuit (e.g., a capacitor or a voltage source) to the selected bit line to increase the voltage of the selected BL and WL during the ramp down current. For example, in FIG. 2A, this can involve connecting the capacitor C to the selected bit line BL0 and, in FIG. 2B, this can involve connecting the voltage source 240 to the selected bit line BL0. The increase in the voltage can be continuous in all or a portion of a time period of the ramp down current in step 704. Step 706 includes ending the ramp down current to the selected word line and step 707 includes disconnecting the capacitor or voltage driver from the selected bit line. In the case of a capacitor, this step can include short circuiting the capacitor to be ready for the next write cycle.

FIG. 7B depicts a flowchart of an example process for isolating memory cells in the set operation of FIG. 7A. Step 710 begins an isolation process for an unselected memory cell. Step 711 includes setting the decoder transistors of the respective unselected word line and unselected bit line in a non-conductive state. For example, in FIG. 2A, this can involve setting any of the decoder transistors Wd0, Wd1 and Wd3 of the respective unselected word lines WL0, WL1 and WL3, and any of the decoder transistors Bd1-Bd3 of the respective unselected bit lines BL1-BL3, in a non-conductive state.

Step 712 includes setting first and second transistors connected to the respective unselected word line and bit line in a conductive state to pass an isolation voltage (e.g., Vmid) to the respective unselected word line and bit line. For example, in FIG. 2A, this can involve setting any of the first transistors W0, W1 and W3 connected to the respective unselected word lines in a conductive state, and setting any of the second transistors B1-B3 connected to the respective unselected bit line in a conductive state. The sequence of these steps may be varied. In a standby mode and until the write set cycle starts, the decoder transistors may be off and the unselect transistors on. Then, the unselect transistor on the BL and WL to be selected are turned off, and the select transistors of the selected WL and BL are turned on.

Figure 8A:
FIG. 8A depicts an example plot of current in a memory cell versus time during a set operation, using the circuit of FIG. 2A.

FIG. 8A depicts an example plot of current in a memory cell (Icell) versus time during a set operation, using the circuit of FIG. 2A. The time scale, which is in nanoseconds (nsec.), is the same in FIGS. 8A and 8B. This example includes a read operation before a set operation. To save power, a choice may then be made to not write a selected memory cell if it is already in the correct state. When a set operation is to be performed, the controller provides write data which represents the data states which are to be represented by a set of memory cells, such as a set of memory cells connected to a selected word line. The data states can be represented by the low resistance (set) and high resistance (reset) states, for example. If the write data indicates that a memory cell should be in the low resistance state and the read operation indicates the memory cell is currently in the low resistance state, the memory cell can be excluded or unselected from the set operation. If the write data indicates that a memory cell should be in the low resistance state and the read operation indicates the memory cell is currently in the high resistance state, the memory cell is selected in the set operation.

At 40-65 nsec., voltages are applied to the selected word line and selected bit line to allow the selected memory cell to be read. The set operation occurs from about 70-190 nsec. The read voltages across the tile, such as 7 V and 1 V, may be transitioned to 8 V and 0 V, respectively. During this time, the write current source 132 begins to increase the current to a peak level such as 40 µA from about 60-70 nsec. 40 µA is chosen so the edge rate on the selected wires (control lines) does not increase so fast as to couple the neighbor unselected wires so much that an unselected cell triggers on and false selects. Then, after 70 nsec., the selection element of the selected memory cell is on and the risk of false coupling into a neighbor memory cell is greatly reduced with the selected WL and BL voltages moving away from the power supplies of 8 V and 0 V. Then, the current may be increased to 50% or more of the reset current. For example, with a reset current of 100 µA, the current may be increased to 70 µA. The transformation to the low resistance crystalline state begins when the current exceeds about 50 µA for a memory cell which is 20 nm in diameter, as an example. The required current increases in proportion to the memory cell radius squared.

A current ramp down occurs from about 90-190 nsec. in which the current decreases at an approximately constant rate from the peak level to about 30 µA or less. The gradual ramp down current helps ensure the resulting state is the lower resistance crystalline state instead of the higher resistance amorphous. Recall that the amorphous state occurs when there is a fast ramp down of current in less than 10 nsec., for instance. The voltage control circuit is activated during the ramp down of the current and may then be discontinued by disconnecting the selected BL from the voltage control circuit 122a by unselecting the BL. Then, the capacitor in the voltage control circuit may be shorted by turning on the transistor 212 until the next write cycle begins. The set operation is successfully completed at 190 nsec. Note that the time, current and voltages depicted in FIG. 8A to 9B are merely non-limiting examples.

Note also that the discontinuities in Icell in FIG. 8A at t=120 and 160 nsec. are from transient noise injected onto the power supplies. Such discontinuities may result in a higher resulting resistance in the memory cell and are to be minimized by good power distribution regulation with wide buses on the chip that keep power supply excursions under 5%.

Figure 8B:
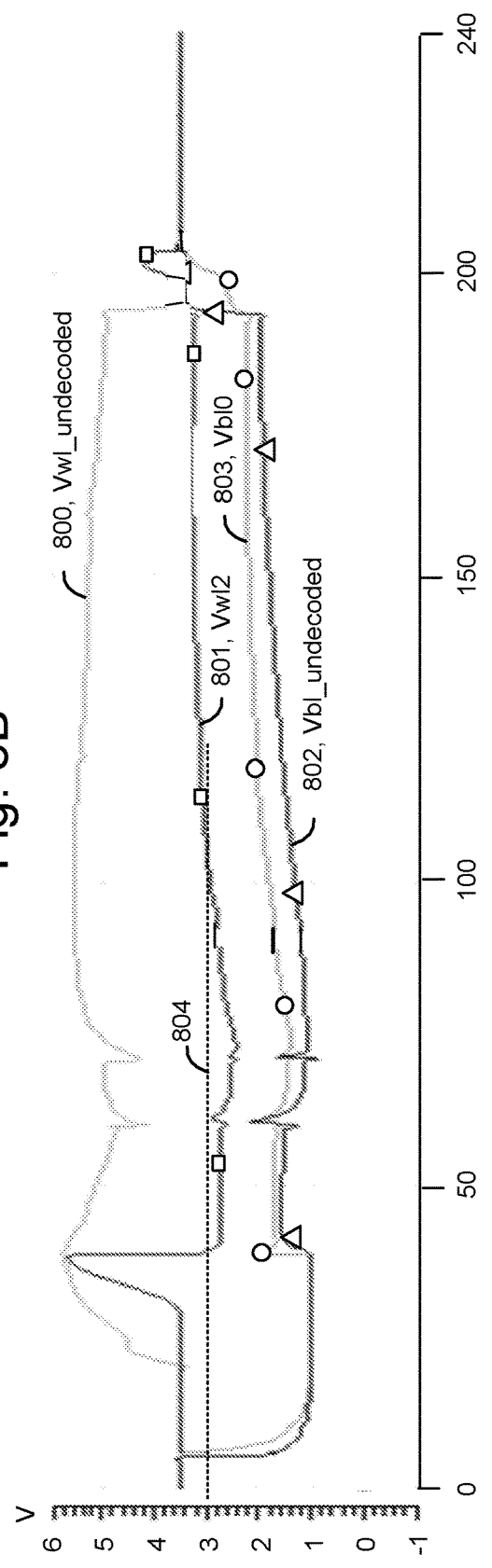
FIG. 8B depicts example plots of word line and bit line voltages versus time during a set operation consistent with FIG. 8A.

FIG. 8B depicts example plots of word line and bit line voltages versus time during a set operation consistent with FIG. 8A. A plot 800 depicts the undecoded word line drive voltage, Vwl_undecoded, on path 230 in FIG. 2A, a so called "global" voltage. Vwl_undecoded, the voltage output of the current source, may decrease as the current decreases. In one embodiment, Vwl_undecoded continuously decreases on a first control line for at least a majority of a time period in which a ramp down current is applied to a memory cell from a current source in a write operation. A plot 801 depicts the decoded word line voltage Vwl2 on WL2, for example, in FIG. 2A. A plot 802 depicts the undecoded bit line voltage, Vbl_undecoded, on path 231 in FIG. 2A. A plot 803 depicts the decoded bit line voltage Vbl0 on BL0, for example, in FIG. 2A. Vwl2>Vbl0 allows the write current to be provided while decreasing Vwl_undecoded results in decreasing Icell. Vbl_undecoded is driven by the voltage control circuit.

Referring also to FIG. 8A, at 40 nsec., the current and voltage on the selected word line initially overshoot when the memory cell selection element triggers and discharges capacitances of the selected WL and BL. After this transient, the memory cell current settles to a desired level for the read operation, such as 20 μA for a 20 nm diameter phase change memory element that minimizes the chance of false write for the selected element during read. During the set operation, Icell increases and then decreases, Vwl_undecoded also increases and then decreases. Vwl_undecoded is set to levels which allow the current source to provide a desired Icell. However, Vwl2 may continue to increase even as Vwl_undecoded and Icell decrease, due to the voltage control circuit on the selected BL. The voltage control circuit therefore counteracts the decrease in the voltage output of the current source with an increasing voltage. When the voltage control circuit comprises a capacitor, a relatively smaller capacitor will result in a relatively larger increase of the selected BL voltage. Further, a relatively smaller capacitor may result in a relatively smaller decline in the selected WL voltage, compared to the case where the capacitor is not used, or, the relatively smaller capacitor will result in an increase in the selected WL voltage. The above is true because a relatively smaller capacitor will charge up relatively faster as it accumulates charge from the bit line. Vwl2 is initially below 3 V (dotted line 804) and here, for example, exceeds 3 V for a majority of the time period of the ramp down of Icell. For example, Vwl2<3 V from 90-105 nsec. and Vwl2>=3 V from 105-190 nsec. Vwl2>=3 V for 85% of the time period of the ramp down current.

When Vwl2 is below 3 V, the second transistor B0 in FIG. 2A is in a clamp condition. However, when Vwl2 exceeds 3 V, the clamp condition for the second transistor B0 is advantageously avoided. Without the voltage control circuit, Vwl2 would remain below 3 V and provide the second transistor B0 in FIG. 2A in the clamp condition, potentially preventing a successful completion of the set operation. Vbl_undecoded and Vbl0 also increase correspondingly with Vwl2 during the decrease of Icell. Vbl0 is higher than Vbl_undecoded and lower than Vwl2, voltages that are determined by the IR voltage across the selected WL and BL which is a function of the (decoded) bit location along the WL and BL.

Generally, the voltage control circuit can provide a continuous increase in the bit line and/or word line voltages for a portion of the time period in which the current ramp down occurs. The time of the continuous increase is determined by the time that the transistor 212 is turned off. In another possible aspect, the voltage control circuit avoids a decrease in the bit line and/or word line voltages for a portion of the time period in which the current ramp down occurs. This amount of time can be sufficient to keep the bit line and/or word line voltages in a range which prevents the clamp condition. This portion of the time period can be a majority of the time period.

Figure 9A:
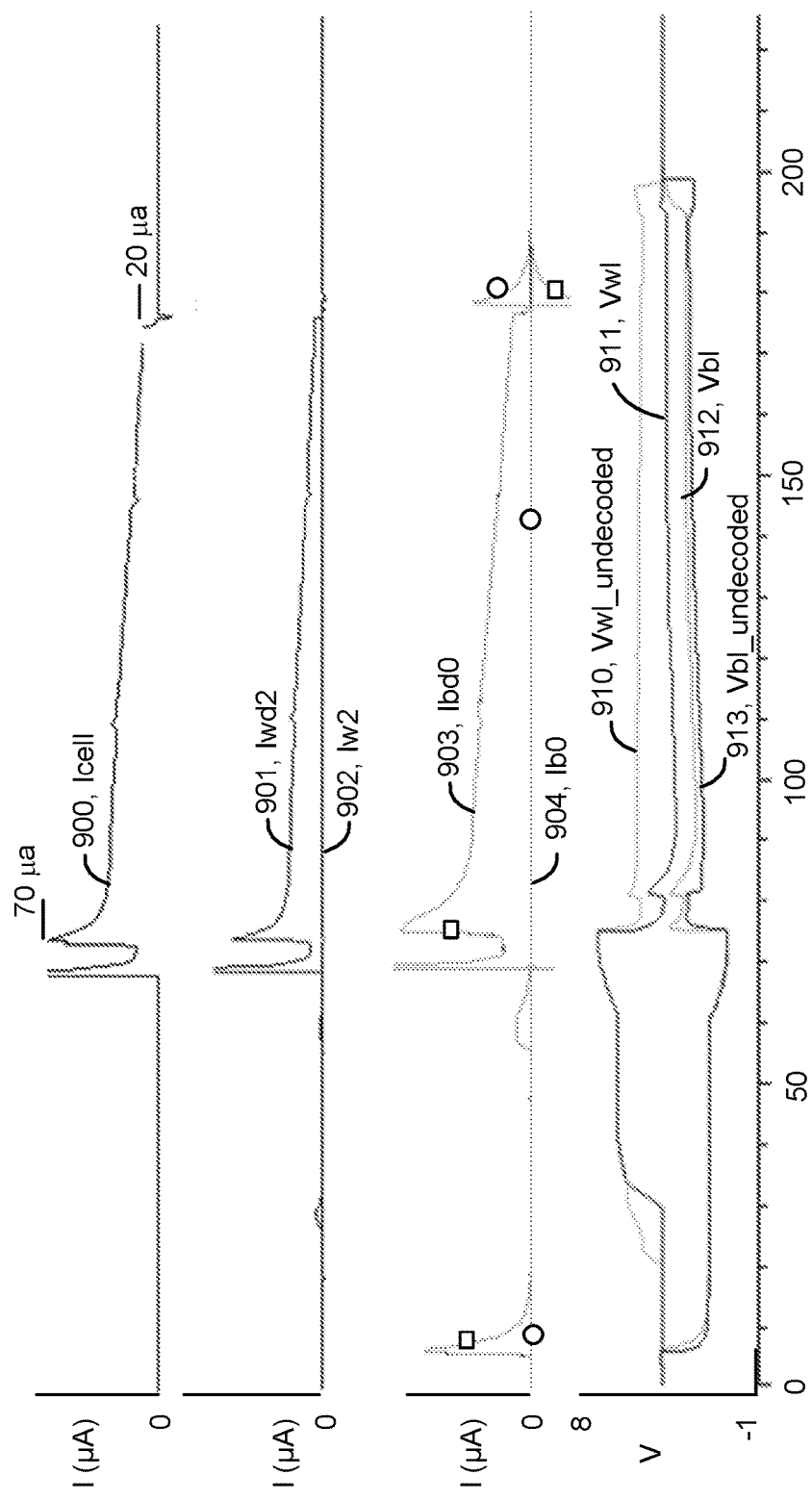
FIG. 9A depicts an example plot of currents and voltages versus time in another set operation for a selected memory cell, using the circuit of FIG. 2A.

FIG. 9A depicts an example plot of currents and voltages versus time in another set operation for a selected memory cell, using the circuit of FIG. 2A. For this non-limiting example, the set operation occurs from about 75-180 nsec. Icell is increased and then ramps down from about 75 to 175 nsec. The voltage control circuit is active, e.g., connected to the selected bit line, during the ramp down so that Vbl (plot 912) and Vwl (plot 911) are moderated to decrease slower or gradually increase during the ramp down.

A plot 900 represents the memory cell current, Icell. The current settles at a peak level of 70 μA at 75 nsec. to start the write set current ramp down, which ends with the current decreasing to 30 μA at 175 nsec. A plot 901 represents the current through the word line decoder transistor Wd2, Iwd2, and this equals Icell as long as the first transistor W2 is not in the clamp condition. A plot 902 represents the current in W2, Iw2, which is zero in this example. If a current were to flow through W2 to the memory cell, Icell would equal the sum of the currents through Wd2 and W2.

Similarly, a plot 903 represents the current through the bit line decoder transistor Bd0, Ibd0, and this equals Icell as long as the second transistor B0 is not in the clamp condition. A plot 904 represents the current in B0, Ib0. If a current were to flow through B0 to the memory cell, Icell would equal the sum of the currents through Bd0 and B0. Plots 910, 911, 912 and 913 represent Vwl_undecoded, Vwl, Vbl and Vbl_undecoded, respectively, similar to FIG. 8B. Advantageously, Vwl and Vbl increase during the ramp down of Icell to keep the first and second transistors out of the clamp condition. This allows Icell to ramp down to a desired minimum level of 20 μA, in this example.

FIG. 9B depicts an example plot of currents and voltages in a set operation for a selected memory cell versus time, using a circuit similar to the circuit of FIG. 2A but excluding the voltage control circuit 122, as a comparison to FIG. 9A. For example, the capacitor or the voltage driver of the voltage control circuit can be short circuited and not connected to the selected bit line.

In FIG. 9B, plots 930, 931, 932 and 933 represent Vwl_undecoded, Vwl, Vbl and Vbl_undecoded, respectively. The set operation occurs from about 75-180 nsec. as in FIG. 9A. Icell is increased and begins ramping down from about 85 to 175 nsec. Since a voltage control circuit is not used, Vbl (plot 932) and Vwl (plot 931) are flat to slightly decreasing during the ramp down. This allows the first and second transistors W2 and B0 to enter the clamp condition and potentially prevent the successful completion of the set operation. In fact, Icell is prevented from ramping down to the desired minimum level of 20 μA and instead ramps down to a minimum current of 55 μA. Specifically, the current settles at a peak level of 70 µA at 82 nsec. to start the write set current ramp down, which ends with the current decreasing to 55 µA at 192 nsec.

A plot 920 represents the memory cell current, Icell. A plot 921 represents the current through the word line decoder transistor Wd2, Iwd2, a plot 922 represents the current in W2, Iw2 and a plot 923 represents the sum of Iwd2 and Iw2. In contrast to FIG. 9A, Iw2 is non-zero and increases during the ramp down of Icell.

A plot 924 represents the current through the bit line decoder transistor Bd0, Ibd0, and a plot 925 represents the current in B0, Ib0. In this example, no current flows through B0 so that B0 is not in the clamp condition.

Figure 10A:
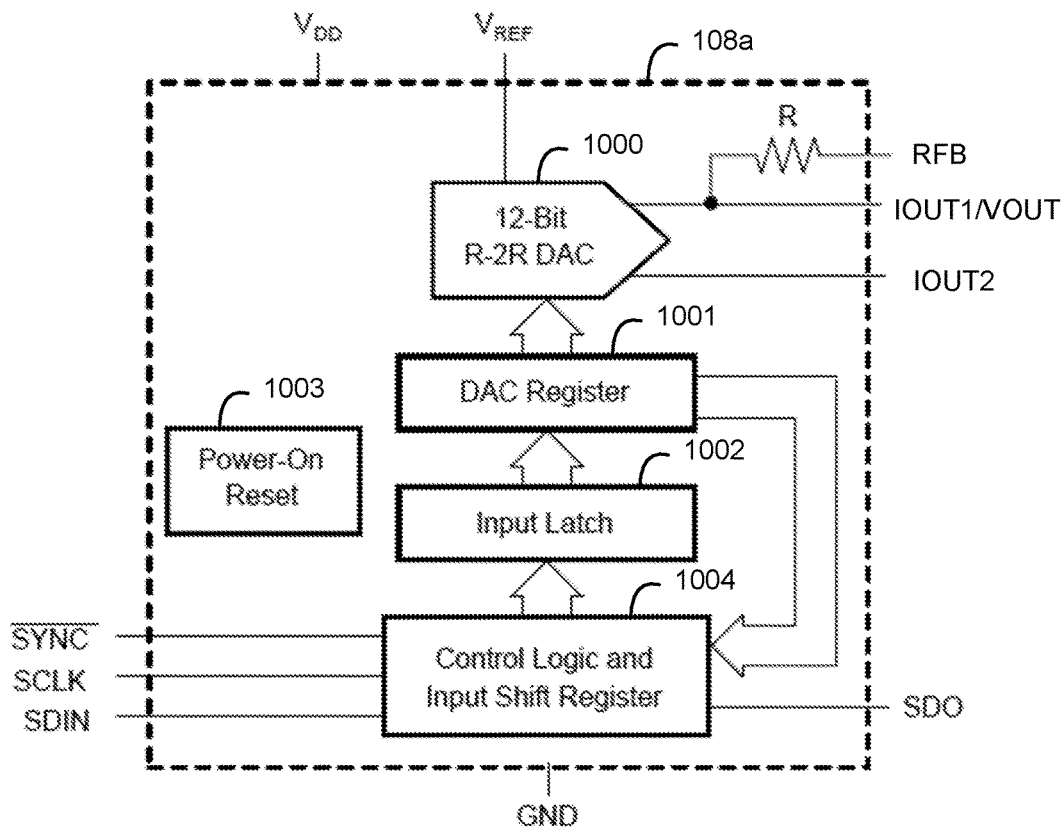
FIG. 10A depicts an example block diagram of the write current source 132 of FIG. 1.

FIG. 10A depicts an example block diagram of the write current source 132 of FIG. 1. A current source can be implemented in different ways. This example is based on the model DAC7811 from Texas Instruments, Inc. and comprises 12-Bit, Serial Input, Multiplying Digital-to-Analog Converter. The current source can be used to provide a decreasing current through a memory cell in a set operation, as discussed. The current source outputs a current based on a digital input. As the digital input changes, the current is incrementally stepped down to provide a continuous ramp down. The current source includes a 12-bit R-2R DAC 1000, a DAC register 1001, an input latch 1002, a control logic and input shift register 1004 and a power on reset circuit 1003.

Inputs to the control logic and input shift register include NOT(SYNC), SCLK and SDIN. NOT(SYNC) is an Active Low Control Input. This is a frame synchronization signal for the input data. When SYNC goes low, it powers on buffers for SCLK and SDIN, and the input shift register is enabled. Data is loaded to the shift register on the active edge of the following clocks. The serial interface counts the clocks and data is latched to the shift register on the 16th active clock edge. SCLK is a Serial Clock Input. By default, data is clocked into the input shift register on the falling edge of the serial clock input. SDIN is a Serial Data Input. Data is clocked into the 16-bit input register on the active edge of the serial clock input. On power-up at the power-on reset, data is clocked into the shift register on the falling edge of SCLK. SDO is a serial data output of the control logic and input shift register, such as for chaining multiple devices.

Outputs of the DAC 1000 include RFB, IOUT1 and IOUT2. RFB is feedback resistor for the DAC. IOUT1 is the current output of the DAC and this is the ramp down current used for a set operation as discussed herein. VOUT is an output voltage of the current source, which is the same as Vwl_undecoded or Vbl_undecoded when the current source is connected to a word line or bit lien, respectively. IOUT2 is an analog ground of the DAC.

Figure 10B:
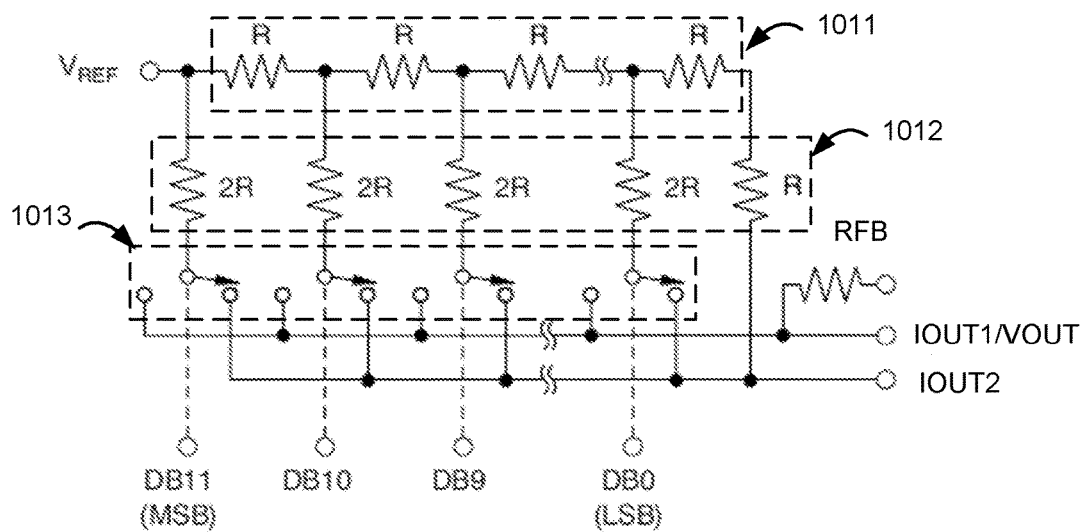
FIG. 10B depicts an example of the DAC circuit 1000 of FIG. 10A.

FIG. 10B depicts an example of the digital-to-analog converter (DAC) circuit 1000 of FIG. 10A. The circuit is digitally controlled based on twelve data bits, DB0-DB11, where DB0 is the least significant bit (LSB) and DB11 is the most significant it (MSB). The circuit includes a set of resistors 1011 of resistance R arranged serially, and a set of resistors 1012 of resistance 2R arranged in parallel in different legs of the ladder. Additionally, each 2R resistor is connected to a switch in a set of switches 1013 which can connect the resistor to an output path IOUT1 or IOUT2 based on a value of a respective data bit. The circuit receives a reference voltage Vref which is used to generate currents in the different legs and which determines the DAC full-scale current. Based on the data bits, a corresponding current is provided as an output. As the data input changes during the set operation, the output current can ramp down as depicted in FIG. 8A to 9B.

A digitally controlled current source can provide a stepped change in a current that is made smoother by adding capacitance on the output. Other types of current sources can be used as well.

In one embodiment, an apparatus comprises: a memory cell connected at one end to a first control line (WL2) and at another end to a second control line (BL0); a first transistor (W2) connected in parallel to the first control line and configured to connect an isolation voltage (4 V) to the first control line when the memory cell is unselected and to disconnect the isolation voltage from the first control line during a write operation for the memory cell; a current source configured to provide a current through the memory cell via the first control line during the set operation; and a voltage control circuit (122) connected to the second control line and configured to increase a voltage on the second control line during the set operation.

In one approach, the memory cell is among a plurality of memory cells arranged in a plurality of rows and a plurality of columns; each column is connected to a respective second control line (BL0-BL3); and the voltage control circuit is connected to a respective decoder transistor (Bd0-Bd3) for each respective second control line.

In another embodiment, a method comprises: applying a ramp down current over a time period to a selected word line in a memory array in a write operation for a selected memory cell, where the selected memory cell is connected to the selected word line and to a selected bit line; during the time period, disconnecting an isolation voltage from the selected word line using one first transistor (e.g., W2), connecting the isolation voltage to an unselected word line using another first transistor (e.g., W0, W1 and W3), and accumulating charge in a capacitor connected to the selected bit line.

In another embodiment, an apparatus comprises: a memory cell having one terminal connected to a first control line and another terminal connected to a second control line; means, connected to the first control line, for writing data to a memory cell by applying a current to the memory cell; and means for continuously increasing a voltage of a second control line for at least a majority of a time period in which the current is applied to the memory cell.

In various embodiments, the means for applying the current can include the write current source 132 of FIGS. 1, 10A, and 10B, the row control circuitry 130, the column control circuitry 120, and the controller 140, or other logic hardware, and/or other executable code stored on a computer readable storage medium. Other embodiments may include similar or equivalent means for accumulating the counts.

Further, the means for increasing the voltage can include the voltage control circuits 122, 122a and 122b of FIGS. 1, 2A, and 2B, including the capacitor C of FIG. 2A and the voltage source 240 of FIG. 2B, the row control circuitry 130, the column control circuitry 120, and the controller 140, or other logic hardware, and/or other executable code stored on a computer readable storage medium. Other embodiments may include similar or equivalent means for accumulating the counts.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a memory cell connected at one end to a word line and at another end to a bit line;
a first isolation transistor connected to the word line and configured to connect an isolation voltage to the word line when the memory cell is unselected and to disconnect the isolation voltage from the word line during a write operation for the memory cell;
a current source configured to provide a current through the memory cell via the word line during the write operation, wherein the current source is configured to increase the current to a peak level and, in a time period, continuously ramp down the current from the peak level until a completion of the write operation;
a voltage control circuit connected to the bit line via a first path;
a second path connected to the bit line;
the voltage control circuit comprising a capacitor connected to the bit line via the first path, and a first transistor connected to one side of the capacitor and to another side of the capacitor, wherein the another side of the capacitor is connected to ground by a second transistor, a control gate of the second transistor is connected to ground by a resistor, and a voltage of the another side of the capacitor is above ground at least by a threshold voltage of the second transistor;
the first transistor is configured in a conductive state to short circuit the one side of the capacitor to the another side of the capacitor to provide a starting voltage on the bit line at a start of the time period and is then configured in a non-conductive state to disconnect the one side of the capacitor from the another side of the capacitor to allow the capacitor to collect charge from the bit line to continuously increase the voltage on the bit line throughout for at least 50% of the time period; and
at other times than during the write operation, the first transistor is configured in the conductive state to short circuit the one side of the capacitor to the another side of the capacitor to allow a voltage to be provided on the bit line via the second path.

2. The apparatus of claim 1, wherein:
a source of the first isolation transistor is connected to the word line; and
the capacitor is configured to increase a voltage on the bit line during the write operation by an amount which is sufficient to prevent the first isolation transistor from entering a clamp condition in which a voltage of the source falls below Vcg−Vth, where Vcg is a control gate voltage of the first isolation transistor and Vth is a threshold voltage of the first isolation transistor.

3. The apparatus of claim 2, wherein:
a drain of the first isolation transistor is connected to the isolation voltage.

4. The apparatus of claim 1, further comprising:
a second isolation transistor connected to the bit line, the second isolation transistor is configured to connect the isolation voltage to the bit line when the memory cell is unselected and to disconnect the isolation voltage from the bit line during the write operation.

5. The apparatus of claim 4, wherein:
a source of the second isolation transistor is connected to the bit line; and
the capacitor is configured to increase a voltage on the bit line during the write operation by an amount which is insufficient to cause the second isolation transistor to enter a clamp condition in which a voltage of the source exceeds Vcg+Vth, where Vcg is a control gate voltage of the second isolation transistor and Vth is a threshold voltage of the second isolation transistor.

6. The apparatus of claim 4, wherein:
the first isolation transistor comprises an n-MOSFET having a p-type well within an n type well within a p-type substrate; and
the second isolation transistor comprises a p-MOSFET having an n type well within the p-type substrate.

7. A system, comprising:
a controller; and
a memory die connected to the controller, the memory die comprises:
a cross-point array of phase change memory cells, the phase change memory cells comprising first and second terminals;
a set of word lines connected to the first terminals;
a set of bit lines connected to the second terminals;
a set of first decoders connected to the set of word lines;
a set of second decoders connected to the set of bit lines;
a current source connected to the set of first decoders;
a capacitor connected to the set of second decoders via a first path; and
a first transistor connected to one side of the capacitor and to another side of the capacitor, wherein:
the another side of the capacitor is connected to ground by a second transistor;
a control gate of the second transistor is connected to ground by a resistor;
a voltage of the another side of the capacitor is above ground at least by a threshold voltage of the second transistor; and
the first transistor is configured in a conductive state to short circuit the one side of the capacitor to the another side of the capacitor to provide a starting voltage on the first path at a start of a write operation and is then configured to disconnect the one side of the capacitor from the another side of the capacitor to allow the capacitor to collect charge from the first path to continuously increase a voltage on the first path during at least a majority of a time period in which a current of a memory cell ramps down from a peak level to a minimum level in the write operation.

8. The apparatus of claim 1, wherein:
the current is ramped down from the peak level at a constant rate.

9. The apparatus of claim 1, wherein:
the capacitor is configured to collect charge from the bit line to continuously increase the voltage on the bit line throughout the time period.

10. The apparatus of claim 1, wherein:
the first transistor comprises an n-channel MOSFET.

11. The apparatus of claim 1, wherein:
the second transistor comprises a p-channel MOSFET.

12. The apparatus of claim 1, wherein:
the starting voltage is stored in the capacitor at a start of the write operation.

13. The apparatus of claim 7, wherein:
at other times than during the write operation, the first transistor is configured in the conductive state to short circuit the one side of the capacitor to the another side of the capacitor to allow a voltage to be provided to the set of second decoders via a second path.

14. The apparatus of claim 7, wherein:
the starting voltage is stored in the capacitor at a start of the write operation.

* * * * *